US012751234B2

(12) United States Patent
Jang et al.

(10) Patent No.: US 12,751,234 B2
(45) Date of Patent: Sep. 29, 2026

(54) SPRAYING NOZZLE TYPE OF AN APPARATUS FOR REMOVING A RESIDUAL GAS ON A WAFER

(71) Applicant: VM Inc., Icheon-si (KR)

(72) Inventors: Hwi Gon Jang, Yongin-si (KR); Woo Hyung Choi, Seongnam-si (KR); Byeong Jun Jung, Icheon-si (KR); Jin Myeong Lee, Yongin-si (KR)

(73) Assignee: VM INC., Icheon-si (KR)

( * ) Notice: Subject to any disclaimer, the term of this patent is extended or adjusted under 35 U.S.C. 154(b) by 107 days.

(21) Appl. No.: 18/789,600

(22) Filed: Jul. 30, 2024

(65) Prior Publication Data

US 2025/0105031 A1 Mar. 27, 2025

(30) Foreign Application Priority Data

Sep. 21, 2023 (KR) ........................ 10-2023-0126014

(51) Int. Cl.
*H10P 72/00* (2026.01)

(52) U.S. Cl.
CPC ...... *H10P 72/0406* (2026.01); *H10P 72/0408* (2026.01); *H10P 72/00* (2026.01); *H10P 72/0414* (2026.01)

(58) Field of Classification Search
CPC ............. H10P 72/0408; H10P 72/0406; H10P 72/0414; H01L 21/67051; H01L 21/67028; H01L 21/02046; H01L 21/6732
See application file for complete search history.

(56) References Cited

U.S. PATENT DOCUMENTS

2022/0359250 A1* 11/2022 Woo .................. H01L 21/67393

FOREIGN PATENT DOCUMENTS

| | | | | |
|---|---|---|---|---|
| KR | 20020044371 A * | 6/2002 | ........ | H01L 21/67028 |
| KR | 101075171 B1 * | 10/2011 | ........ | H01L 21/67115 |
| KR | 20180046272 A * | 5/2018 | ....... | H01L 21/67778 |
| WO | WO-2004097927 A1 * | 11/2004 | ............. | H01L 21/68 |
| WO | WO-2020046867 A1 * | 3/2020 | ....... | H01L 21/67393 |

OTHER PUBLICATIONS

Machine translation of KR20020044371A, dated Jun. 15, 2002. (Year: 2002).*
Machine translation of KR-20180046272-A, dated May 8, 2018. (Year: 2018).*
Machine translation of KR-101075171-B1, dated Oct. 19, 2011. (Year: 2011).*

* cited by examiner

*Primary Examiner* — Michael E Barr
*Assistant Examiner* — Kevin G Lee
(74) *Attorney, Agent, or Firm* — CANTOR COLBURN LLP

(57) ABSTRACT

An apparatus for removing a residual gas on a wafer comprises at least one spraying nozzle disposed at a front of a loading volume formed within a housing and extending linearly along a horizontal direction respectively; and a plurality of spraying holes formed at each spraying nozzle along the extending direction of each spraying nozzle, wherein the residual gas or a contaminating matter on a surface of the wafer is removed by a gas or a CDA (Clean Dry Air) sprayed through the plurality of the spraying holes.

6 Claims, 4 Drawing Sheets

SPRAYING NOZZLE TYPE OF AN APPARATUS FOR REMOVING A RESIDUAL GAS ON A WAFER

BACKGROUND OF THE INVENTION

Field of the Invention

The present invention relates to a spraying nozzle type of an apparatus for removing a residual gas on a wafer, in particular the apparatus for removing a residual gas or a deteriorating matter adhered on the wafer by a sprayed gas from a liner spraying nozzle.

Description of the Related Art

Various gases may be used in the semiconductor industry, and a gas remaining on a wafer after a process can be discharged in the atmosphere. The discharged gas may generate additional by-products, thereby the additional by-products may afflict a bad effect to a process to be performed. And some gas used in the process may be toxic to harm the workers' health on spreading. The wafer may be supplied to an equipment through a FOUP (Front Opening Unified Pod), and the wafer may be delivered to the FOUP for removing a residual gas on the wafer after a process to the wafer is performed. And also, if the wafer is stored within the FOUP immediately after the process is finished, then the residual gas may affect other wafers that are not processed. Therefore, the processed wafer can be stored within a side storage for being separated from non-processed wafers. Such side storage may include a means for spraying a nitrogen or CDA (clean dry air) and a means for storing the wafer for removing the residual gas. It is advantageous that the side storage has a structure to remove various kinds of foreign matters capable of being adhered on the wafer. However, a technology to remove the foreign matters effectively is not known in this art. Therefore, a skill to remove the matters effectively needs to be developed. Specifically, an apparatus for removing various foreign matters capable of being adhered on the wafer needs to be developed.

The present invention is to solve the problem of the prior art and has the following purpose.

PURPOSE OF THE INVENTION

The object of the present invention is to provide with a spraying nozzle type of an apparatus for removing a gas remaining on a wafer by spraying a nitrogen or a CDA (Clean Dry Air) through a plurality of spraying holes formed at one or more spraying nozzle disposed at an opening in order to remove a residual gas or a deteriorating matter effectively.

SUMMARY OF THE INVENTION

In one embodiment of the present invention, an apparatus for removing a residual gas on a wafer comprises at least one spraying nozzle disposed at a front of a loading volume formed within a housing and extending linearly along a horizontal direction respectively; and a plurality of spraying holes formed at each spraying nozzle along the extending direction of each spraying nozzle, wherein the residual gas or a contaminating matter on a surface of the wafer is removed by a gas or a CDA (Clean Dry Air) sprayed through the plurality of the spraying holes.

In other embodiment of the present invention, the at least one spraying nozzle consists of a plurality of spraying nozzles arranged along a vertical direction.

In another embodiment of the present invention, the at least one spraying nozzle comprises a first spraying nozzle group and a second spraying nozzle group arranged in a shape to face each other.

In still another embodiment of the present invention, the plurality of spraying holes are formed in a spiral shape along the extending direction.

In still another embodiment of the present invention, the at least one spraying nozzle is configured to be rotated along a circumferential direction.

In still another embodiment of the present invention, each at least one spraying nozzle extends to an inner direction from a side of the housing and extends in an inclined shape to an outer direction.

In still another embodiment of the present invention, the apparatus further comprises a plurality of loading members disposed within the loading volume and for loading the wafer, and contacting tip contacting the wafer and having a spherical shape, a poly pyramidal shape, a corn shape or a semi spherical shape is formed at each loading member.

In still another embodiment of the present invention, the apparatus further comprises a discharging module formed at a rear side of the housing and the discharging module comprises a discharging plate 63 where a plurality of penetrating holes are formed uniformly.

DETAILED DESCRIPTION OF EXEMPLARY EMBODIMENTS

Figure 1:
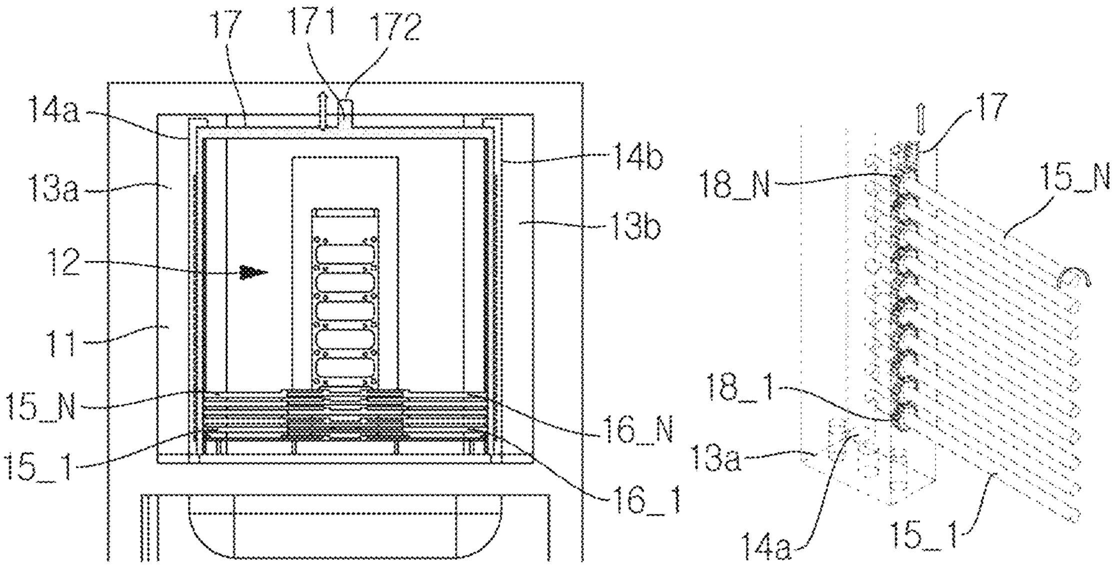
FIG. 1 shows an embodiment of a spraying nozzle type of an apparatus for removing a residual gas on a wafer according to the present invention.

FIG. 1 shows an embodiment of a spraying nozzle type of an apparatus for removing a residual gas on a wafer according to the present invention.

Referring to FIG. 1, An apparatus for removing a residual gas on a wafer comprises at least one spraying nozzle 15_1 to 15_N, 16_1 to 16_N disposed at a front of a loading volume 12 formed within a housing 11 and extending linearly along a horizontal direction respectively; and a plurality of spraying holes 21_1 to 21_L formed at each spraying nozzle 15_1 to 15_N, 16_1 to 16_N along the extending direction of each spraying nozzle 15_1 to 15_N, 16_1 to 16_N, wherein the residual gas or a contaminating matter on the surface of the wafer is removed by a gas or a CDA (Clean Dry Air) sprayed through the plurality of the spraying holes 21_1 to 21_L.

The wafer may be loaded at the loading volume 12 formed within the housing 11, and the wafer may be loaded in a layer structure after it is transferred to the loading volume 12 through the opening. The housing 11 may have various structures capable of loading and storing the wafers therein, but not limited to. An opening for inputting the wafer may be formed at a front part of the housing 11, and at least one spraying nozzle 15_1 to 15_N, 16_1 to 16_N may be placed at the opening or at the front of the loading volume 12. Each spraying nozzle 15_1 to 15_N, 16_1 to 16_N may become a circular rod shape extending linearly and having a circular cross-section, and the gas may flow along the inside of each spraying nozzle 15_1 to 15_N, 16_1 to 16_N. A pair of fixing blocks 13*a*, 13*b* extending vertically may be formed at both sides of the housing 11, and a pair of guiding blocks 14*a*, 14*b* extending in a vertical direction may be coupled to each fixing block 13*a*, 13*b*. And each spraying nozzle 15_1 to 15_N, 16_1 to 16_N may be coupled to the guiding blocks 14*a*, 14*b* in a way that each one end is inserted within the guiding blocks 14*a*, 14*b*, and thereby each spraying nozzle 15_1 to 15_N, 16_1 to 16_N may have a structure to extend horizontally with one end fixed.

The at least one spraying nozzle 15_1 to 15_N, 16_1 to 16_N may be disposed at the guiding blocks 14*a*, 14*b* extending vertically, and the number of spraying nozzle 15_1 to 15_N, 16_1 to 16_N may be two or more. And also, the at least one spraying nozzle 15_1 to 15_N, 16_1 to 16_N may comprise a first spraying group 15_1 to 15_N each end of which is coupled to a first guiding block 14*a* and a second spraying group 16_1 to 16_N one end of which is coupled to the second block 14*b*. Each spraying nozzle 15_1 to 15_1, 16_1 to 16_N consisting of each group may be arranged along a vertical direction, and each spraying nozzle 15_1 to 15_N, 16_1 to 16_N may extend from one side of the housing 11 to a middle portion of the front of the housing 11 or may extend an inward direction. The at least one spraying nozzle 15_1 to 15_N, 16_1 to 16_N may be disposed in various ways, but not limited to.

A plurality of spraying holes may be formed at each spraying nozzle 15_1 to 15_N, 16_1 to 16_N. Each spraying nozzle 15_1 to 15_N, 16_1 to 16_N may extend linearly, and the plurality of spraying holes may be formed along the extending direction of each spraying nozzle 15_1 to 15_N, 16_1 to 16_N. A gas input into the guiding blocks 14*a*, 14*b* may flow to each spraying nozzle 15_1 to 15_N, 16_1 to 16_N. And then, the gas may be sprayed to the outside through the spraying holes formed at each spraying nozzle 15_1 to 15_N, 16_1 to 16_N to remove the residual gas or the contaminating matter remaining on the surface of the wafer. The spraying holes may be made as various structures capable of spraying the gas, but not limited to.

According to one embodiment of the present invention, each spraying nozzle 15_1 to 15_N, 16_1 to 16_N may be rotated in a circumferential direction. As shown in the left part of FIG. 1, each rotation guiding unit 18_1 to 18_N having a function similar to a pinion gear and having a cylindrical or a drum-like shape may be coupled at one end part of each spraying nozzle 15_1 to 15_N, 16_1 to 16_N. A plurality of engaging teeth may be formed at the circumferential surface of each rotation guiding unit 18_1 to 18_N to engage a linear bracket 17 for rotating. The linear bracket 17 may comprise a pair of vertical extending portions and a connecting portion for connecting the upper ends of the pair of vertical extending portions. The pair of vertical extending portions may have a function similar to a rack gear, and the pair of the vertical extending portion may have linear teeth engaging the engaging teeth of the rotation guiding units 18_1 to 18_N. A guiding tap 171 may be formed at a middle part of the connecting part to move up and down along a tap guide 172. The moving tap 171 may move up and down by a driving means such as a pneumatic cylinder or a motor, and if the moving tap 171 moves up and down, then the pair of vertical extending parts can move up and down. Hence, the rotation guiding units 18_1 to 18_N engaged to the pair of vertical extending parts may rotate for rotating each spraying nozzle 15_1 to 15_N, 16_1 to 16_N.

The plurality of spraying nozzles 15_1 to 15_N, 16_1 to 16_N can rotate in various ways, for example, the second spraying nozzle group 15_1 to 15_N can rotate along the circumferential direction independently to the first spraying nozzle group 16_1 to 16_N. And also, each spraying nozzle 15_1 to 15_N, 16_1 to 16_N may rotate along the circumferential direction independently each other. An angle of each spraying hole may be regulated depending on an outer diameter of the water or the wafer condition according to the kind of process. As the linear bracket 17 moves along the upward and downward directions, the spraying direction of each spraying hole formed at the spraying nozzle 15_1 to 15_N, 16_1 to 16_N may be changed, and thereby the spraying direction can be changed continuously. Therefore, the gas such as the nitrogen or the CDA may be sprayed uniformly on the surface of the wafer to remove effectively the contaminating matter such as the residual gas or a fume. The spraying angle of each spraying hole may be regulated in various ways, but not limited to.

Figure 2:
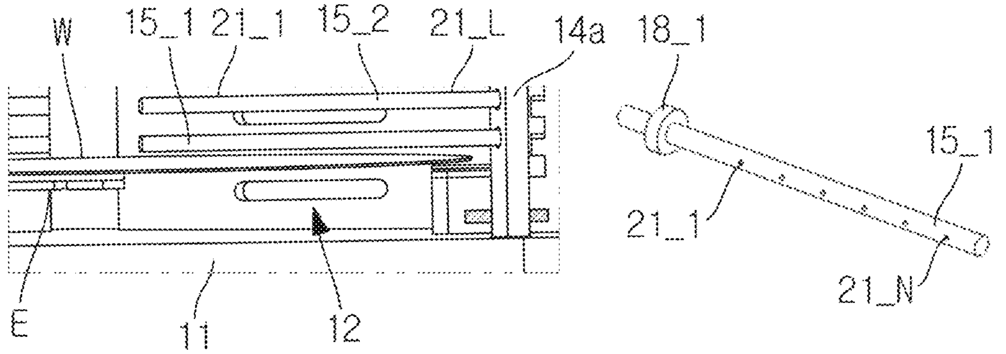
FIG. 2 shows an embodiment of a spraying nozzle for the apparatus according to the present invention.

FIG. 2 shows an embodiment of a spraying nozzle for the apparatus according to the present invention.

Referring to FIG. 2, the plurality of spraying nozzles 15_1, 15_2 with an identical or similar shape each other may be arranged along a vertical direction with a constant separating distance. Each spraying nozzle 15_1, 15_2 may extend from a guiding block 14*a* to in an inward direction of the loading volume 12 formed within the housing 11, and each spraying nozzle 15_1 to 15_2 may extend to a position corresponding to a predetermined distance X from an end effector. And also, a lower part of each spraying nozzle 15_1, 15_2 may be located at a position corresponding to a predetermined height Y from the upper surface of the wafer moving to the loading volume 12 for loading. The predetermined distance X and the predetermined height Y may be determined in various ways, and a vertical distance between two spraying nozzles 15_1, 15_2 adjacent to each other vertically may be determined based on the predetermined height Y.

Referring to the right part of FIG. 2, each spraying nozzle 15_1, 15_2 may have a linear rod shape, and a plurality of spraying holes 21_1 to 21_L may be formed at each spraying nozzle along the extending direction. And also, the rotation guiding unit 18_1 having a cylindrical or a drum-like shape may be coupled to one end of each spraying nozzle 15_1, 15_2.

According to one embodiment of the present invention, the plurality of holes 21_1 to 21_N may be formed in a spiral shape along the extending direction of each spraying nozzle. Specifically, a position of a spraying hole 21_K located at the center of each spraying nozzle 15_1, 15_2 may be determined, and a spraying hole 21_1 located at a starting position and a spraying hole 21_N located at an end position along both directions of each spraying nozzle 15_1, 15_2 may be determined based on the spraying hole 21_K located at the middle position. For example, the first spraying hole 21_1 may be located at a position where the circumferential angel is 45 degrees from the spraying hole 21_K of the middle position along the clockwise direction. The last spraying hole 21_N may be located at a position where the circumferential angle is 45 degrees along the counterclockwise direction.

Such positions of spraying holes 21_1 to 21_N along the circumferential surface of each spraying nozzle 15_1, 152 may be determined based on the wafer W. Specifically, a spraying hole 21_K located at the center of the wafer W may have, for example, 70 to 80 degrees to a straight line extending in a direction vertical to the surface of the wafer W and passing the center of each spraying nozzle 15_1, 15_2. And for example, the spraying hole 21_1 or 21_N located at the farthest positions may be located at position where the angle to the vertical straight line is 20 degrees. And the remaining holes 21_2 to 21_ (K-1), 21_(K+1) to 21_(N−1) may be located at the positions between the spraying hole of the middle position and the spraying holes of the farthest position. In this way, a gas such as the sprayed nitrogen may be sprayed on the total surface of the wafer without being lost to the outside of the wafer W by the plurality of spraying holes 21_1 to 21_N positioned in a spiral shape along the circumferential direction of each spraying nozzle 15_1, 15_2. The spraying holes 21_1 to 21_N may be formed at each spraying nozzle 15_1, 15_2 in various ways to guide the sprayed gas on the surface of the wafer, but not limited to.

Figure 3:
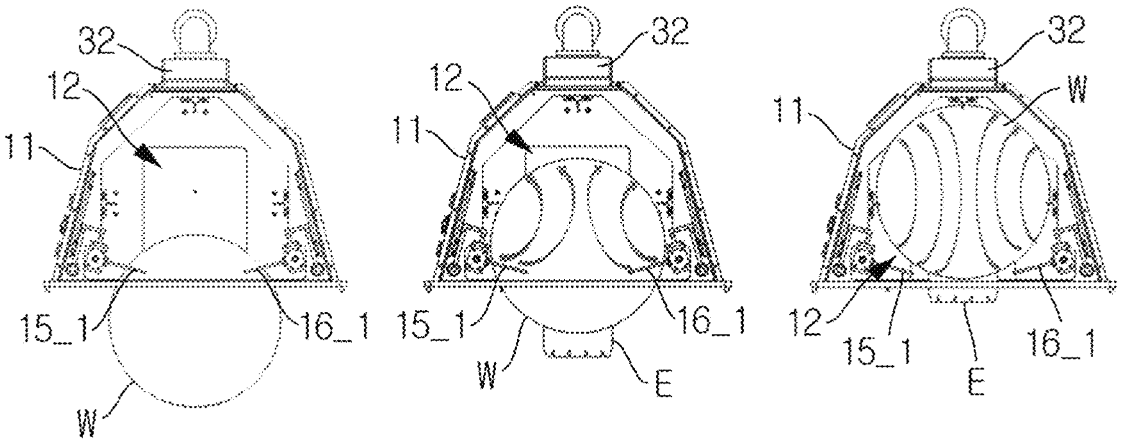
FIG. 3 shows an embodiment of a gas flow structure for removing a gas or a contaminating matter for the apparatus according to the present invention.

FIG. 3 shows an embodiment of a gas flow structure for removing a gas or a contaminating matter for the apparatus according to the present invention.

Referring to FIG. 3, each spraying nozzle 15_1 to 15_N, 16_1 to 16_N may extend from the side of the housing 11 to an inward direction and may be inclined to the outside. The wafer W may be moved to the loading volume 12 formed within the housing 11 by an end effector E, and the wafer W may be moved to the loading volume 12 through the opening of the housing 11. As shown in the left part of FIG. 3, the wafer W may pass a nozzle fixing block formed at the opening of housing 11 where the ends of the spraying nozzles 15_1, 16_1 are fixed. Each spraying nozzle 15_1, 16_1 may be inclined to the outside direction from the fixed one end.

An exhausting port 32 may be formed at a rear part of the housing 11. The gas may not be sprayed until a portion of the wafer W corresponding to ⅓ of the wafer diameter enters the housing 11. And then, the wafer W may move to the loading volume 12, and the gas for removing the residual gas or contaminating matters may be sprayed from the spraying nozzles 15_1, 16_1 when a portion of the wafer W corresponding to ½ of the wafer diameter enters the housing 11 as shown at the middle part of FIG. 3. The gas sprayed from the spraying nozzles 15_1 to 16_1 may be sprayed on a portion of the wafer inputted into the housing 11. As shown at the right part of FIG. 3, when the wafer W enters the loading volume 12 completely and becomes in a loaded state, the gas from the spraying nozzles 15_1, 16_1 may be sprayed over the whole surface of the wafer W. In this way, when the wafer W enters completely and is loaded in the loading volume, the gas or the CDA from the spraying nozzles 15_1, 16_1 may be sprayed uniformly on the hole surface. The gas sprayed from the spraying nozzles 15_1, 16_1 may be regulated in various ways, but not limited to.

Figure 4:
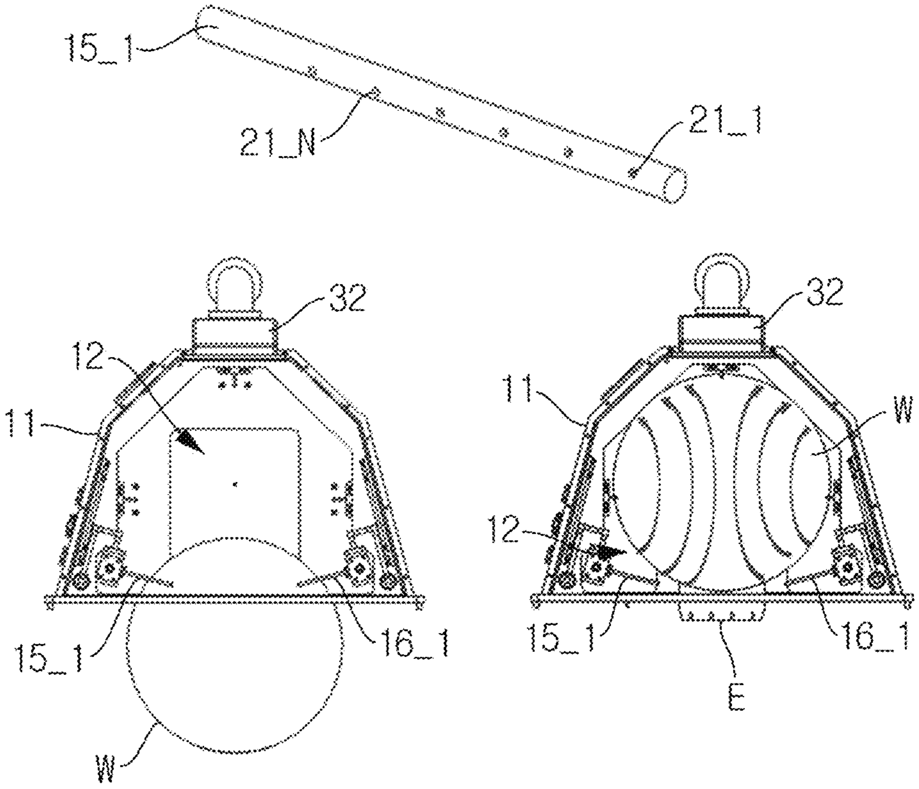
FIG. 4 shows an embodiment of a gas spraying structure by the spraying nozzle for the apparatus according to the present invention.

FIG. 4 shows an embodiment of a gas spraying structure by the spraying nozzle for the apparatus according to the present invention.

Referring to FIG. 4, the plurality of spraying holes 21_1 to 21_K may be formed at the spraying nozzle 15_1, and the plurality of spraying holes 21_1 to 21_K may be arranged at the spraying nozzle in a spiral shape along the extending direction. A location of each hole 21_1 to 21_K along the extending direction of the spraying nozzle 15_1 may be determined based on the wafer W. Specifically, the spraying hole, for example, 21_K formed at the position corresponding to a portion adjacent to the center of the wafer W may have a smallest angle to the surface of the wafer W in the loading state. And the spraying hole 21_1, for example, formed at a position corresponding to a portion located far away from the center of the wafer W may have a large angel relatively to the surface of the wafer W. Specifically, the spraying holes 21_1 to 21_K may be formed in order that the gas can reach an edge of the wafer being in the loading state.

As described above, the spraying nozzles 15_1, 16_1 may be inclined outwardly along the extending direction, and an inclination degree may be determined as the spraying hole 21_K, for example, formed at the ends of the spraying nozzles 15_1, 16_1 may be directed to the center of the wafer W. The gas sprayed from the spraying holes 21_1 to 21_K may flow uniformly on the whole surface of the wafer W to remove the residual gas and the contaminating matter such as the fume by the spraying nozzles 15_1, 16_1 structure extending in an inclined way and the spraying holes 21_1 to 21_K with the spiral arranging structure. Referring to the right part of FIG. 4, the spraying nozzles 15_1, 16_1 may be arranged at the front part of the opening of the housing 11 or at the front part of the loading volume 12, and the spraying nozzles 15_1, 16_1 may be arranged at both sides. And the gas sprayed from the spraying holes 21_1 to 21_K may form a plurality of flowing circular paths whose curvature radii gradually decrease in both directions from the center of the wafer W with respect to the surface of the wafer W. Thereby, the spraying gas is not lost and the gas may be sprayed uniformly on the whole surface of the wafer W. The regulation for the spraying condition of the gas may be set in various ways, but not limited to.

Figure 5:
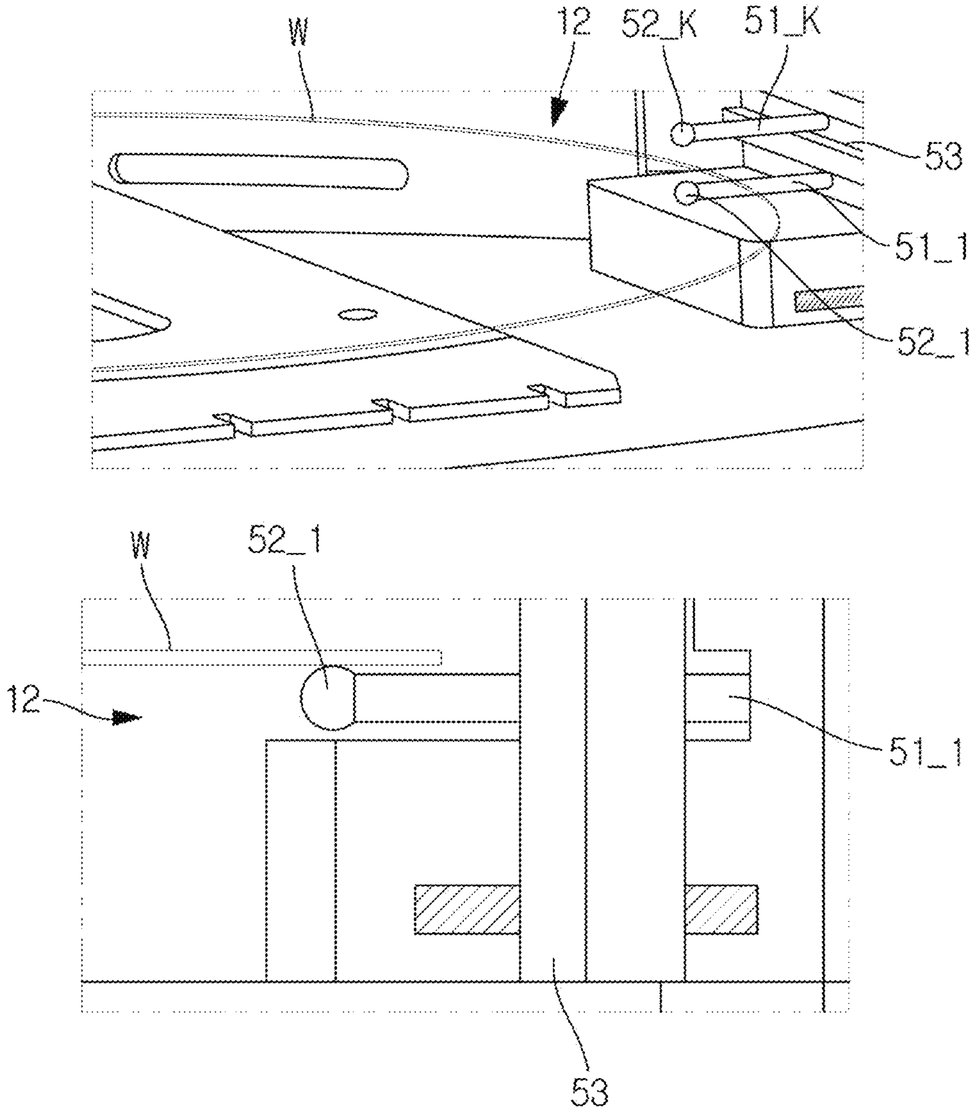
FIG. 5 shows an embodiment of a structure for loading a wafer within the apparatus according to the present invention.

FIG. 5 shows an embodiment of a structure for loading a wafer within the apparatus according to the present invention. Referring to FIG. 5, the apparatus may further comprise a plurality of loading members 51_1 to 51_K arranged at the loading volume 12 for loading the wafer W, and a contacting tip 52_1 to 52_K contacting the wafer W may be formed at an end part of each loading member 51_1 to 51_K. The contacting tip 52_1 to 52_K may have a spherical, a horn-like or a semi-spherical shape, but not limited to. The plurality of loading members 51_1 to 51_K may be installed at the loading volume 12 for loading the plurality of wafers W, and the plurality of loading members 51_1 to 51_K may support the lower surfaces of the wafers W.

At least one portion of the wafer W may be supported by the plurality of the loading members 51_1 to 51_K. Some contaminating matter may exist at certain loading members 51_1 to 51_K having such function, and a residual gas or a contaminating matter existing at a wafer area where the loading members 51_1 to 51_K are in contact may not be removed by the nitrogen gas or the CDA. Therefore, it is more advantaged as the wafer area where the loading members 51_1 to 51_K are in contact become smaller. The plurality of loading members 51_1 to 51_K may be arranged at regular intervals along vertical direction with one end of each loading members 51_1 to 51_K fixed at a member fixing block 53. And the contacting tip 52_1 to 52_K with the spherical, the horn-like or the semi-spherical shape may be formed at one end part of each loading member 51_1 to 51_K. Hence, the wafer W may contact the end of each loading member 51_1 to 51_K in a dot contacting form to minimize a contacting area. The contacting tips 52_1 to 52_K may have various shape in which the other part except the end parts of loading members 51_1 to 51_K W can separate from the wafer W for minimizing the contacting area except, but not limited to.

Figure 6:
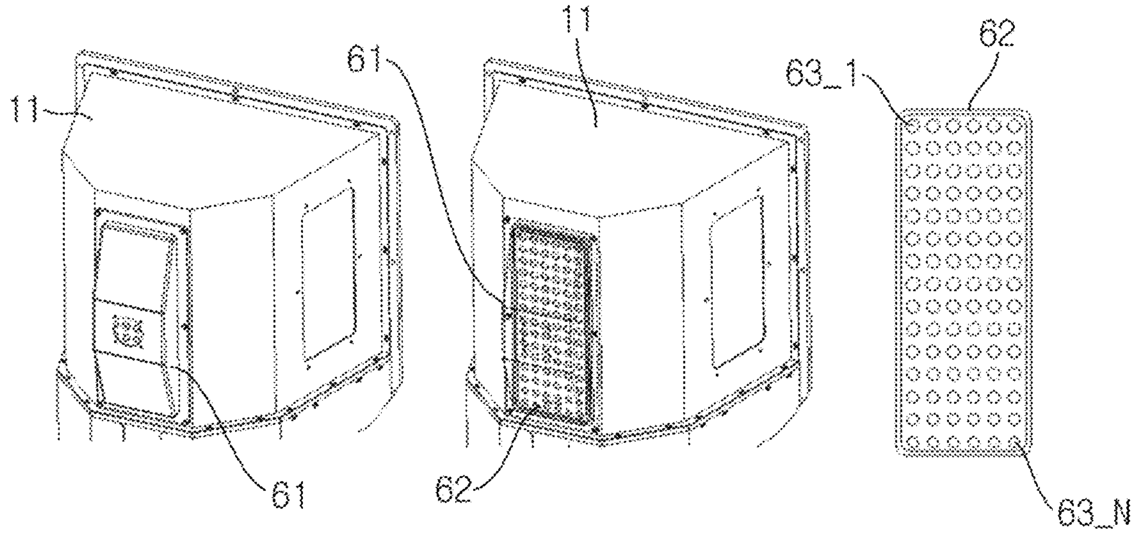
FIG. 6 shows an embodiment of a discharging plate for the apparatus according to the present invention.

FIG. 6 shows an embodiment of a discharging plate for the apparatus according to the present invention.

Referring to FIG. 6, the apparatus further comprises a discharging module 16 formed at a rear side of the housing 11, and the discharging module 61 may comprise a discharging plate 62 where a plurality of penetrating holes 63_1 to 63_N are arranged uniformly. The gas sprayed from the spraying nozzles arranged at the housing 11 may contain residual gases or contaminating matters removed from the wafer, and the gas should be discharged to the outside of the housing 11. The discharging module 61 may be formed at the rear and an upper part of the housing 11, and the gas may be discharged to the outside. A discharging duct may be connected to an outlet formed at the discharging module 61 to discharge the gas from the housing 11 to the outside.

The discharging plate 62 may be formed at an inner part of the discharging module 61, and the discharging plate 62 may have a rectangular shape on the whole. The plurality of penetrating holes 63_1 to 63_N may be formed uniformly in two dimensional matrix shape at the discharging plate 62, and the discharged gas may flow through the plurality of the penetrating holes 63_1 to 63_N to be discharged to the outside through the outlet. A pressure of the gas discharged through the plurality of penetrating holes 63_1 to 63_N may be controlled to be discharged effectively through the outlet. The discharging plate 62 may have various structures, but not limited to.

What is claimed is:

1. An apparatus for removing a residual gas on a wafer, comprising:

a plurality of spraying nozzles disposed at a front of a loading volume formed within a housing, and each spraying nozzle extending linearly along a horizontal direction and having a linear rod shape; and a plurality of spraying holes formed at the each spraying nozzle along the extending direction thereof, wherein the residual gas or a contaminating matter on a surface of the wafer is removed by a gas or a CDA (Clean Dry Air) sprayed through the plurality of spraying holes, wherein the plurality of spraying nozzles are arranged along a vertical direction so that a lower part of the each spraying nozzle is located at a position corresponding to a predetermined height from an upper surface of the wafer moving to the loading volume, and wherein the plurality of spraying holes are formed in a spiral shape along the extending direction of the each spraying nozzle.

2. The apparatus according to claim 1, wherein the plurality of spraying nozzles comprises: a first spraying nozzle group and a second spraying nozzle group facing the first nozzle group.

3. The apparatus according to claim 1, wherein the each spraying nozzle is configured to be rotated along a circumferential direction.

4. The apparatus according to claim 1, wherein the each spraying nozzle extends to an inner direction from a side of the housing and extends in an inclined shape to an outer direction.

5. The apparatus according to claim 1, further comprising: a plurality of loading members disposed within the loading volume and for loading the wafer, and a contacting tip contacting the wafer and having a spherical shape, a poly pyramidal shape, a corn shape or a semi spherical shape is formed at each loading member.

6. The apparatus according to claim 1, further comprising: a discharging module formed at a rear side of the housing, wherein the discharging module comprises a discharging plate having a plurality of penetrating holes formed uniformly.

* * * * *